Feb. 10, 1970 W. L. FULTON 3,495,196

TELEVISION TUNER PRESET FINE TUNING ARRANGEMENT INCLUDING A DRIVE PINION WHICH IS DISENGAGED FROM THE TUNING SLUG AT THE EXTREMES OF SLUG MOVEMENT

Filed July 31, 1968 2 Sheets-Sheet 1

INVENTOR.
WILLIAM L. FULTON

BY J. Patrick Cagney
Atty.

INVENTOR.
WILLIAM L. FULTON
BY J. Patrick Cagney
Atty.

United States Patent Office 3,495,196
Patented Feb. 10, 1970

3,495,196

TELEVISION TUNER PRESET FINE TUNING ARRANGEMENT INCLUDING A DRIVE PINION WHICH IS DISENGAGED FROM THE TUNING SLUG AT THE EXTREMES OF SLUG MOVEMENT

William Leonard Fulton, Roselle, Ill., assignor to Standard Kollsman Industries, Inc., Melrose Park, Ill., a corporation of Illinois Filed July 31, 1968, Ser. No. 749,147
Int. Cl. H03j *5/02*
U.S. Cl. 334—51 4 Claims

ABSTRACT OF THE DISCLOSURE

A preset fine tuning arrangement is disclosed in conjunction with a television tuner of the type which includes individual gear driven slugs at each of the channel positions. An axially shiftable pinion provides disengagement of the gearing drive at either end of the slug stroke, thereby avoiding the need for slippage in the slug retaining means.

My invention relates to an improvement in the drive gear means of a television preset fine tuning structure, and more particularly represents an improvement over the type of gear shift means which is disclosed in my U.S. Patent No. 3,248,674 issued April 26, 1966.

Present day television tuners typically include a rotatable assembly having a plurality of individual channel positions circumferentially disposed thereabout. As the assembly is rotated, individual groups of electrical contacts are brought into engagement with stator contacts connected to the tuner circuitry, and thereby serve to select a desired one of the broadcast channels.

In order to provide an exact adjustment of the picture and audio quality, it is necessary to provide a fine tuning control. The fine tuning control typically operates in conjunction with the oscillator coil, with the individual oscillator coils having an axially displaceable slug member adjustably controlled to vary the impedance of the coil and hence the oscillator frequency. The adjustment of the individual slugs is provided by an individual slug gear at the free end of each slug. A drive gear, operatively connected to a preset fine tuning control knob, is normally displaced from the slug gear of the selected channel. When the fine tuning knob is rotated in either direction, the fine tuning drive gear is first brought into engagement with the slug gear of the selected broadcast channel. Upon further rotation input of the fine tuning control knob, the fine tuning drive gear will be rotated, with such rotational movement being translated to the slug drive gear. The slug drive gear will then be axially translated to adjust the oscillator frequency.

The longitudinal movement of the slug gear is limited by a stroke length between inward and outward end extremes. Some means must be provided for preventing stripping of the threaded engagement between the slug and its complementary threadable retaining means at the ends of the stroke. One way in which this has typically been achieved is to provide a slippage arrangement between these two threadable members. Such thread slippage arrangements are typically shown in U.S. Patent Nos. 3,141,147 and 3,249,902. It has been found, however, that such thread slippage arrangements do not provide as positive a thread retaining means as is achieved by a conventional threaded engagement of appreciable length. Also, these various slippage structures have tended to complicate the manufacturing processes and affect the ultimate reliability of tuner performance.

My aforementioned U.S. Patent No. 3,248,674 avoids the need for such a thread slippage arrangement by longitudinally positioning the fine tuning drive gear between axially inward and axially outward positions. This axial movement of the drive gear is related to the longitudinal translation of the slug gear, such that the slug gear rides off the edge of the drive gear at either end of its stroke. Thus, a further rotational input to the preset fine tuning control knob in the same rotation direction will not be geared to the slug gear, and hence stripping of the retaining thread can not take place. Should the preset fine tuning control knob then be rotated in the opposite direction, the drive gear will be axially shifted to reestablish engagement with the previously disengaged slug gear, and permit longitudinal translation thereof in the opposite direction.

My present invention avoids certain problems of the previous structure, while retaining its basic advantages, in the provision of a minimum length structure, which longitudinally shifts the drive pinion while maintaining the pinion parallel to the axes of the slug gear and of the channel selector shaft. Further, my invention may be readily incorporated within a particularly advantageous type of fine tuning mechanism including a radially shifting plate, of the basic type shown in Delp U.S. Patent No. 3,218,589.

Basically, I achieve the above-noted advantages by mounting the drive gear means on a radially shifting plate which is biased to normally locate the drive gear means radially away from the slug gear and disengaged therefrom. Upon rotation of the preset fine tuning shaft in either direction, the shifting plate is moved radially inward to effect engagement between the teeth of the fine tuning drive gear and the slug gear, and between the idler gear and preset fine tuning shaft gear. The slip clutch member for producing this radially inward movement of the plate also includes an additional cam extension. This cam extension acts in conjunction with a frusto-conical cam follower surface on the outer end of the gear shaft to effect axial movement of the drive gear simultaneously with the radial movement thereof and while maintaining the axis of the drive gear parallel to the axes of the slug gear and the channel selector shaft.

It is therefore seen that a primary object of the instant invention is to provide an improved gearing arrangement in conjunction with a television preset fine tuning structure.

A further object of the instant invention is to provide within a preset fine tuning structure a shift means for disengaging the gearing at the ends of the slug stroke, in a manner which avoids jamming of the gears.

Another object of the instant invention is to provide in combination with a fine tuning arrangement of a tuner having a plurality of slug driven gears circumferentially disposed thereabout, a fine tuning drive means which axially shifts the slug drive gear simultaneously with radial movement towards the individual slug driven gear, while continuously maintaining the axis of the slug drive gear parallel to the axis of the slug driven gear.

An additional object of the instant invention is to provide a preset fine tuner, wherein the slug drive gear is disengaged from the individual slug gear at either end of the slug stroke with the pitch lines of all engaged gears being maintained parallel at all times.

Still a further object of the instant invention is to provide a minimum length preset fine tuning drive structure, which effects disengagement of the drive gearing from the slug gear at either end of the slug stroke.

These as well as other objects of the invention will be come readily aparent upon a consideration of the following description and drawings in which.

Figures 3, 3A:
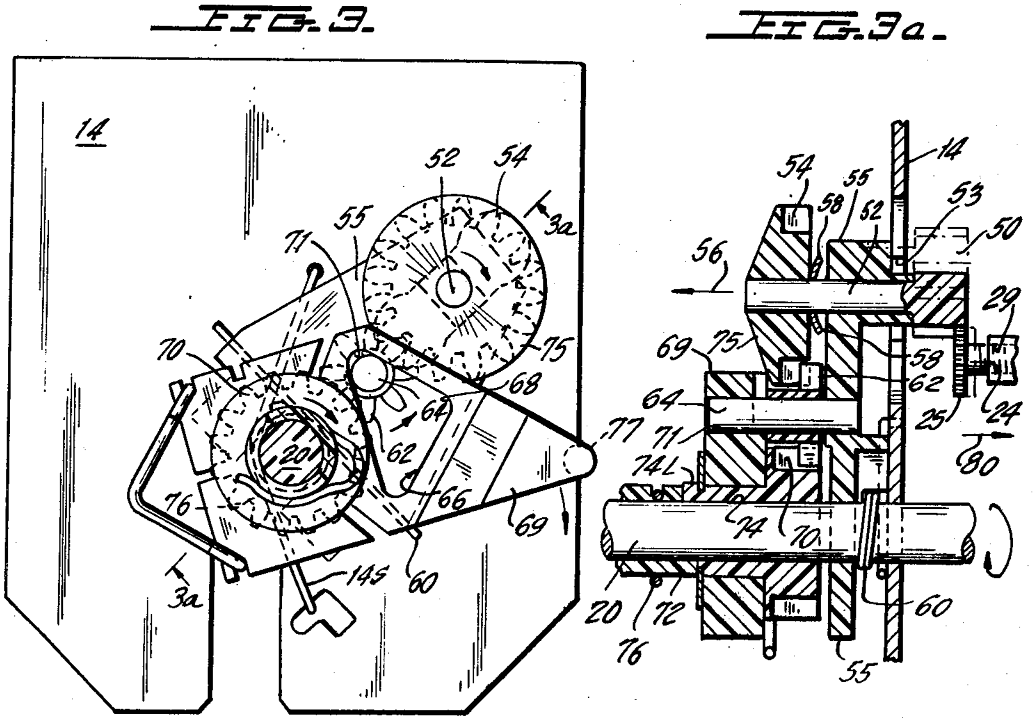
FIG. 3 shows the gearing portion of FIG. 2 enlarged, and coresponding to one of the actuated positions of the preset fine tuning structure.

FIG. 3*a* is a cross-sectional view of FIG. 3, looking in the direction of the arows, and showing the gearing engagement, and axial displacement of the drive gear.

Figure 4A:
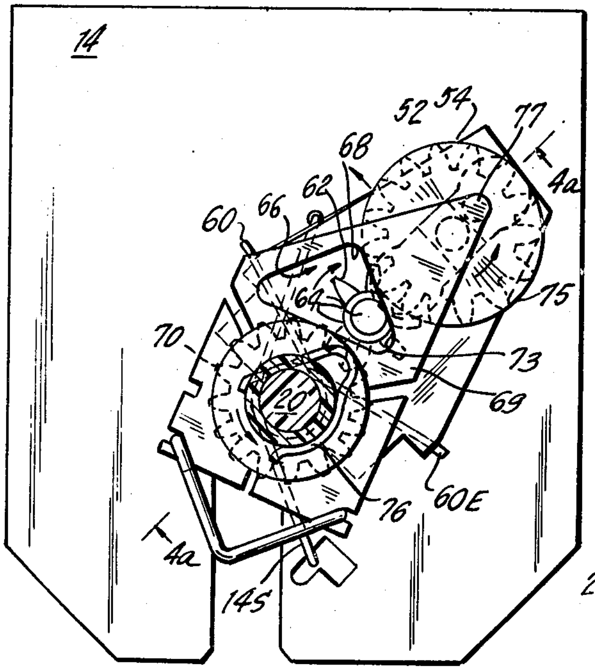
Figure 4:
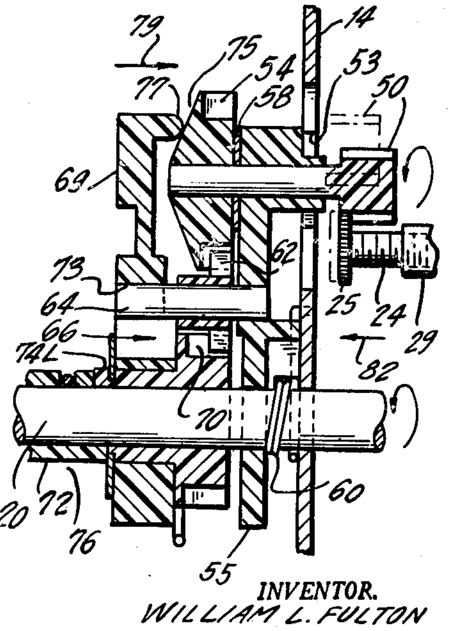

FIGS. 4 and 4*a* correspond to FIGS. 3 and 3a respectively, and represent the preset fine tuner and its other mode of actuation, with the drive gear being axially shifted.

Figure 1:
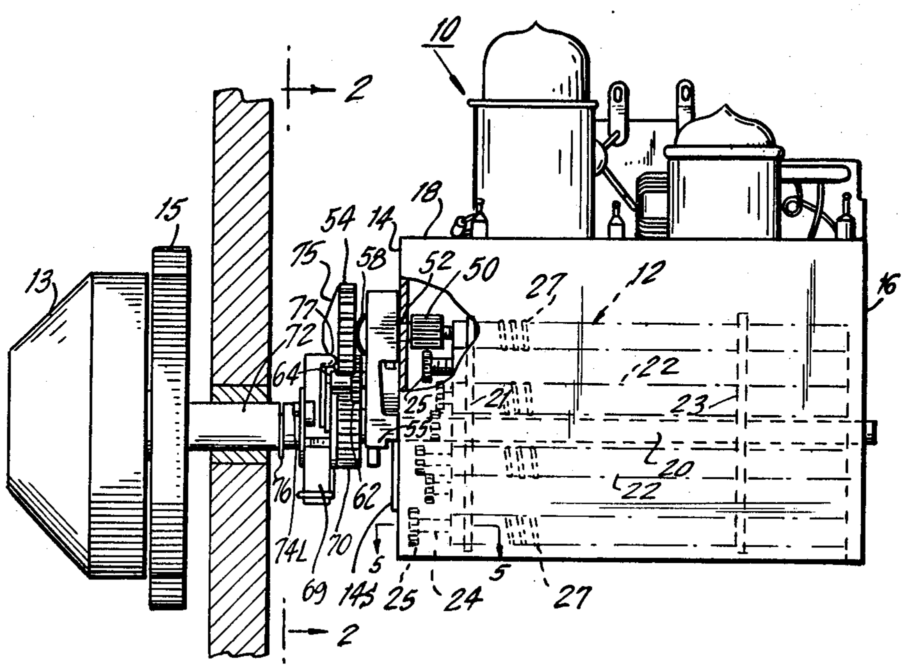
FIG. 1 is a side elevational view partially cut away, showing a television tuner employing the instant invention, with the preset fine tuning being shown in the neutral, or at-rest position.
Figure 5:
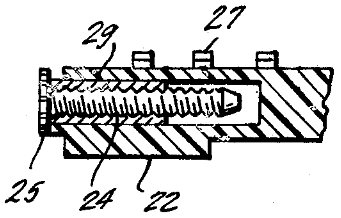

FIG. 5 is a cross-sectional view along the lines 5—5 of FIG. 1, showing the threaded engagement of the slug.

Figure 2:
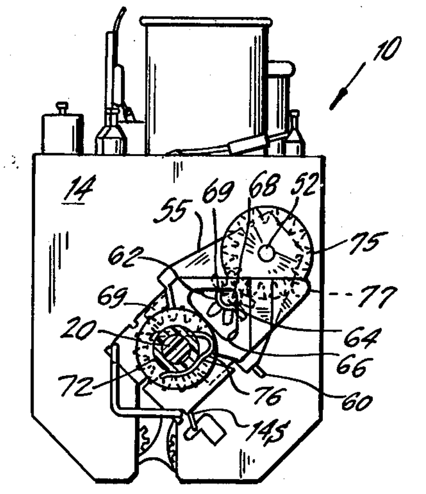
FIG. 2 is an end view of FIG. 1, as indicated by the arrows 2—2, showing the gearing engagement.

Referring initially to FIGS. 1 and 2, tuner 10 is shown as a turret tuner of the same general type illustrated in U.S. patent application (B–239) Ser. No. 677,105 filed Oct. 23, 1967. It should, however, be understood that this is only an illustrative environment wherein the instant invention may be employed, and that my novel fine tuning structure may likewise be utilized in other tuner structures, such as the switch type tuner shown in Delp U.S. Patent Nos. 3,141,147 and 3,218,589.

The turret tuner 10 includes a rotatable turret assembly 12 supported by the end walls 14, 16 of metallic chassis 18. A channel selector shaft 20 is provided to which are mounted axially spaced end support discs 21, 23 which include recesses for receiving the circumferentially disposed individual channel sticks 22. Shaft 20 is held to the chassis end walls 14 and 16 by a pair of springs, one of which is shown by 14S. Shaft 20 is manually rotated to the desired channel position by chanel selection knob 13. As shown in FIG. 5, each of the channel sticks 22 includes an oscillator coil 27 at one end and a longitudinally translatable slug member 24 movable therein to fine tune the oscillator frequency. Slug member 24 includes a gear means 25 secured to its free end.

When the desired channel is selected, the associated slug gear 25 is circumferentially located at a position adjacent the slug drive gear 50. As will be henceforth described, drive gear 50 is selectively moved into engagement with the slug gear 25 of the selected channel, and rotates same in either rotational direction for moving the slug 24 either into or out of the threaded retaining means 29 at the end of the channel stick 22. Threaded retaining means 29 in the form of a tapped sleeve includes an appreciable length in threaded engagement with the externally threaded portion of the slug 24. Threaded retaining means 29 may also take the form of a thin walled tubular member having opposed diametrical indentations of suitable pitch spacing to engage the external thread along the length of slug 24.

Reference is now made to the additional FIGS. 3, 3*a*, 4 and 4*a* for showing the details of the fine tuning drive mechanism. Slug drive gear 50 is integrally formed on the inner end of shaft 52, which is supported by shiftably mounted plate 55 and extends through radial opening 53 of the chassis end wall 14. The outer end of shaft 52 carries gear member 54. Shaft 52 is normally biased longitudinally outward in a direction of arrow 56 (FIG. 3*a*) by spring biasing means 58. Plate member 55 is radially biased outward from shaft 20 by spring member 60, to the position shown in FIGS. 1 and 2. In this position, drive gear 50 is radially outward of the slug gear 25 of the selected channel, such that the preset fine tuning adjustment of the individual slugs 24 will be maintained during channel selecting rotation of the turret assembly 12. Correspondingly, channel selection is unhindered by the preset fine tuning feature.

Plate 55 rotatably supports an idler gear 62 that meshes with gear 54 to shift radially therewith. A forwardly extending stub of a mounting shaft 64 of the idler gear is located within an inverted triangularly shaped cam slot 66 of cam 69 which is slip clutch coupled to the preset fine tuning shaft 72. When the parts are at rest, the stub shaft 64 is in the radially outer apex region 68 of the cam slot 66, and thereby will permit the plate member 55 to be at its radially outward extreme, under the influence of a bias spring 60 which encircles the shaft 20 and has two legs acting radially outward against the shiftable plate 55.

A fine tuning control knob 15 is rotatble in either direction for turning a preset fine tuning shaft 72, which is connected to axially offset lugs 74L on an integral stub shaft portion 74 of the fine tuning drive gear 70. Endwise engagement of the shafts 72, 74 is maintained by spring member 76 which is biased into radial groove in shaft 20. Upon rotation of knob 15 the corresponding inclined face presented by the triangular slot 66 is engageable with the stub shaft 64 to move the plate 55 radially inward and engage the idler gear 62 with the gear member 70, which, in turn, is keyed to the preset fine tuning shaft 72. Simultaneously, the slug drive gear 50 is engaged with the slug gear 25 of the selected channel. These operating relationships are shown in FIGS. 3 and 4.

In FIG. 3, the control knob 15 is shown being rotated clockwise thereby rotating slip clutch coupled cam 69 so as to engage its inclined cam surface 71 against the idler gear stub shaft 64. In FIG. 4, the control knob 15 rotates counterclockwise to rotate the cam 69 to bring its cam surface 73 into engagement with stub shaft 64. In either of these positions, the plate 55 will be moved radially inward against the force of bias spring 60, to bring the gears 54, 62 and 70 into engagement as shown in FIGS. 3*a* and 4*a* respectively.

In accordance with the instant invention, the outer end face 75 of gear member 54 is of frusto-conical shape and is engageable by a cam-like extension finger 77 which, as shown herein, is integrally carried at the radially outer end of the cam 69. In the neutral, at rest, position of the fine tuning mechanism, the cam extension 77 is out of axial registry with the follower surface 75, as shown in FIG. 2. At this position, cam extension 77 will just touch or be spaced immediately adjacent the periphery of the cam surface 75, such that the shaft 52 and the slug drive gear 50 are permitted to assume the axially outward limit position under the influence of biasing spring 58.

Upon clockwise rotation of the preset fine tuning knob 15, the slip clutch coupled cam 69 is swung clockwise to the position shown in FIG. 3. In this position, cam extension 77 is even further from engagement with cam 75, such that the shaft 52 and hence the drive gear 50 will still be at the axially outward extreme.

Upon counterclockwise rotation of the present fine tuning control knob 15, the cam 69 is rotated to the position shown in FIGS. 4 and 4*a*, wherein cam member 77 engages the central portion of the cam surface 75 and produces axial inward movement thereof in the direction shown by arrow 79, such that the drive gear 50 moves from the dotted position to the solid position, as shown in FIG. 4*a*. It should be noted that during this translation, the shaft 52 of the drive gear 50 is simultaneously moved radially inward, and axially inward while being maintained at all times parallel to the rotational axis of the slug gear 25 and the axis of shaft 20. During this movement, the pitch lines of gears 70, 62 and 54 will be maintained parallel, so as to provide gearing engagement which is not susceptible to jamming.

Consideration will now be directed to the axial movement of the slug 24 and its associated gear 25. When the fine tuning knob 15 is turned clockwise, the slug drive gear 50 will be moved from the dotted position to the solid position as shown in FIGS. 3 and 3*a*. The slug drive gear 50 is located at its axial outward extreme, and will be maintained in this position upon a subsequent clockwise operation. Such subsequent clockwise rotation, after the initial rotation of the cam 69, is accompanied by a slipping of the cam and a rotation of the gear train 70, 62, 54, 50 and 25, in a direction to move the slug 24 axially inward as shown by the arrow 80. Slug drive gear 50 is a pinion of predetermined axial length related to the stroke length of the slug 24. As the slug driven gear 25 approaches its axially inward extreme, as shown in FIG. 3*a*, the slug gear 25 begins to move beyond the inward edge of the slug drive gear 50. Upon further clockwise rotation, the slug gear 25 rides off the inner edge of the slug drive gear 50, to the dotted position, so as to defeat the engagement therebetween. Hence, a continued clockwise rotation will not serve to rotate the gear 25, thereby avoiding strippage between the external thread of slug 24 and the internally threaded retaining means 29.

Similarly, upon an initial counterclockwise movement of the preset manual control knob 15, the pinion type slug drive gear 50 moves between the dotted and solid positions, as shown in FIG. 4*a*. Slug drive gear 50 is now at its longitudinally and radially inward extremes, having been moved there by the simultaneous camming of 66–64 and 77–75. The cam 69 then proceeds to slip, upon further rotation such that the gear 25 moves axially in the direction of arrow 82 in FIG. 4*a* to move the slug 24 out of its association oscillator coil. This movement can proceed to the axially outward extreme, such that upon a further counterclockwise rotation, the slug 24 rides off the axially outward edge of pinion member 50 (as shown dotted), so as to defeat the engagement therebetween and prevent stripping of the threads upon the application of additional counterclockwise input, in conjunction with a stop member.

After the gear 25 rides off either edge of the pinion 50, as shown by the dotted positions of this gear in either of FIGS. 3*a* or 4*a*, engagement is automatically reestablished when the direction of rotation of the manual knob 15 is reversed. This should be readily understood by first considering the dotted position of FIG. 3*a*, wherein the slug gear 25 is inwardly beyond the edge of drive gear 50. Upon a counterclockwise input to the fine tuning means, slug drive gear 50 is moved inwardly to the position shown in FIG. 4*a*, thereby reestablishing engagement with gear 25, to permit axially outward movement thereof. Conversely, should the gear 25 be displaced outwardly beyond the edge of pinion 50, as shown in FIG. 4*a*, a subsequent clockwise rotational input to the fine tuning means will position the slug drive gear 50 axially outward, as shown in FIG. 3*a*, thereby reestablishing engagement with the slug drive gear 25 for subsequent axially inward movement.

It is therefore seen that the fine tuning structure of the instant invention decouples the input drive gearing from the slug gear at either axial extreme of the slug, while reestablishing the gearing upon the reversal of the knob rotation for moving the slug in the opposite axial direction. The decoupling of gearing is achieved in a compact structure, wherein firm gearing engagement is established to assure easy and reliable operation.

While this invention has been described in conjunction with a particular illustrative embodiment, it is understood that many variations and modifications may be made by those skilled in the art.

The embodiments of the invention in which an exclusive previlege or property is claimed are defined as follows:

1. In a television tuner having a plurality of channel selection positions individually selectable through rotation of the channel selector shaft, a coil arranged at each of said channel positions for tuning of the associated tuner channel circuitry, a slug for each of said coils arranged about the axis of said selector shaft and mounted for axially adjustable inductance coaction with its associated coil, means for threadably retaining said slugs for individual longitudinal displacement within their respective coils and for maintaining the preset slug position, slug gear means affixed to each of said slugs at the outer end thereof, preset tuning mechanism selectively engageable with the particular tuning slug at the tuning position for individually adjusting the axial position of such slug between predetermined first and second end extremes, said preset tuning mechanism including a preset tuning shaft mounted for rotation about an axis parallel to the axes of said slugs, drive gear means mounted off-axis from said preset tuning shaft and shiftable between an engaged position for transmitting rotary motion between said preset tuning shaft and the slug gear means for the slug at said tuning position and a disengaged position, and cooperating means responsive during rotation of said tuning shaft in one directtion for shifting said drive gear means to an axially forward engaged position and responsive during rotation of said tuning shaft in an opposite direction for allowing said drive gear means to remain in an axially rearward engaged position such that the slug gear means at said tuning position becomes disengaged when the corresponding slug reaches the end extreme corresponding to continued rotation of the tuning shaft in one direction and becomes reengaged when the tuning shaft is rotated in an opposite direction, the improvement comprising a support shiftably mounted on said tuner and carrying said drive gear means thereon in axially shiftable relation to said slug gear means and said cooperating means including spring means reacting axially between said support and said drive gear means to effect axial shifting in one direction of said drive gear means, and cam means enageable with said support to control lateral movement thereof between engaged and disengaged positions when said preset tuning shaft is rotated in either direction and engageable with said drive gear means to shift the same axially in opposition to said spring means for one direction of rotation only of said preset tuning shaft.

2. In a television tuner in acordance with claim 1 wherein a slip clutch couples said cam means to said preset tuning shaft.

3. In a television tuner in accordance with claim 1 wherein a slip clutch couples said cam means to said preset tuning shaft and said cam means including a cam portion engageable laterally with said support for both directions of rotation of said preset tuning shaft and a cam extension engageable axially with said drive gear means for one direction of rotation only of said preset tuning shaft.

4. In a television tuner in accordance with claim 3 and wherein said cam means has a triangularly shaped cam slot defining said cam portion, said drive gear means has a frusto-conical outer end face and said cam extension projects axially for engagement with said face.

References Cited

UNITED STATES PATENTS 3,248,674 4/1966 Fulton ______________ 334—51

HERMAN KARL SAALBACH, Primary Examiner

P. L. GENSLER, Assistant Examiner

U.S. Cl. X.R.

74—10.6; 334—57